United States Patent [19]

Sohn et al.

[11] Patent Number: 5,726,738

[45] Date of Patent: Mar. 10, 1998

[54] APERTURE FOR OFF-AXIS ILLUMINATION AND PROJECTION EXPOSURE APPARATUS EMPLOYING THE SAME

[75] Inventors: Chang-jin Sohn, Songtan; Cheol-hong Kim; Woo-sung Han, both of Suwon, all of Rep. of Korea

[73] Assignee: Samsung Electronics Co., Ltd., Suwon, Rep. of Korea

[21] Appl. No.: 689,169

[22] Filed: Aug. 6, 1996

[30] Foreign Application Priority Data

Aug. 7, 1995 [KR] Rep. of Korea ............... 1995-24298

[51] Int. Cl.$^6$ ............... G03B 27/42; G03B 27/52; G03B 27/54
[52] U.S. Cl. ............... 355/53; 355/55; 355/67; 359/227; 359/232
[58] Field of Search ............... 355/53, 54, 40, 355/50, 77; 356/401; 250/548, 559.03; 359/227, 232, 720, 742; 378/147, 150, 151

[56] References Cited

U.S. PATENT DOCUMENTS

| 5,348,837 | 9/1994 | Fukuda et al. | 355/53 X |
| 5,446,587 | 8/1995 | Kang et al. | 355/53 X |
| 5,552,856 | 9/1996 | Shiraishi et al. | 355/530 |

*Primary Examiner*—Arthur T. Grimley
*Assistant Examiner*—Shival Virmani
*Attorney, Agent, or Firm*—Jones & Volentine, L.L.P.

[57] ABSTRACT

An aperture for an off-axis illumination (OAI) and a projection exposure apparatus which employs the same. In the aperture for an OAI having a light-intercepting region and a light-transmitting region, at least a portion of the light-transmitting region is prismoidal and diffracts incident light toward the periphery of the condenser lens. Accordingly, light intensity is increased due to an increased light-transmitting region, which can lead to a reduction in the exposure time required for photolithography procedures and to an increased productivity of semiconductor devices.

9 Claims, 4 Drawing Sheets

APERTURE FOR OFF-AXIS ILLUMINATION AND PROJECTION EXPOSURE APPARATUS EMPLOYING THE SAME

BACKGROUND OF THE INVENTION

The present invention relates to an aperture and a projection exposure apparatus. More particularly, the present invention relates to an aperture for an off-axis illumination which increases light intensity and to a projection exposure apparatus employing the same.

When fabricating an integrated semiconductor device, the amount of impurities doped into fine regions of the silicon substrate must be precisely controlled. Patterns for defining such fine regions generally are formed by photolithography.

In photolithography, a photosensitive film is coated on to a layer where a pattern such as a dielectric layer or a conductive layer is to be formed. A predetermined portion of the photosensitive film is then exposed to light such as ultraviolet light, an electron beam, or X-ray. The photosensitive film is submersed in a developing solution to remove easily soluble portions, and thereby to form a photosensitive pattern. Subsequently, the layer whereon a pattern is to be formed is etched using the photosensitive pattern as an etching mask. Such etching is utilized to form various patterns such as interconnections or electrodes.

To fabricate highly integrated circuits such as a dynamic random access memory (DRAM) of 256M bytes and above, an off-axis illumination (OAI) is applied. In such applications, fluorokrypton (KrF) excimer laser photolithography has been proposed as a useful technique for forming such patterns.

A conventional OAI and an aperture used for the same will be explained in more detail while referring to the attached drawings.

FIG. 1 illustrates the conventional OAI apparatus which includes an aperture 10, a condenser lens 12, a photomask 14, an objective lens 16, and a wafer 18.

Light from a light source is intercepted at the center region of the aperture used for OAI and is transmitted incident on a condenser lens 12 through the outer region thereof. The light transmitted from condenser lens 12 is incident on photomask 14 at a predetermined angle. Of the light transmitted from photomask 14, a noneffective light (+1st-order diffracted light) strays beyond objective lens 16 and effective light (zero-order and -1st-order diffracted light) are focused by objective lens 16 to illuminate on wafer 18.

The aforementioned OAI has the advantages of providing good resolution and having a deep depth-of-focus due to the noneffective diffracted light not being focused. However, a problem of the OAI is that the productivity of the semiconductor device is decreased because the center of the aperture is covered to intercept the vertically incident light from the light source and thus the focused amount of light is less than that of the conventional illumination. Therefore, to enhance the productivity, the exposure time must be extended or the light intensity must be increased.

The aperture used in a conventional OAI will be explained by comparing it to the aperture used in a conventional illumination apparatus.

FIG. 2 includes a plan view and a sectional view of the aperture used in the conventional illumination apparatus. As shown in FIG. 2, the aperture is formed into a doughnut-shape in which the center portion core is a light-transmitting region 20 and the outer portion is a light-intercepting region 22 for intercepting the noneffective light component.

FIGS. 3A and 3B illustrate the aperture used in the conventional OAI. FIG. 3A is a plan view illustrating a quadrupolar aperture. The quadrupolar aperture is prepared by symmetrically arranging four holes 30 for transmitting light and by being covered with a light-intercepting material at its center where light is vertically incident. Hence, only the obliquely incident light is obtained using such an aperture. FIG. 3B is a plan view illustrating an annular aperture of which a center area 34 is covered to intercept light, and a light-transmitting region 32 is formed by a ring surrounding center area 34. In general, the annular aperture has better OAI effects than the quadrupolar aperture.

Assuming that $\sigma 1$, the radius of the light-transmitting region (20 in FIG. 2) of the aperture used in the conventional illumination apparatus is 1, the aperture for the conventional OAI has a light-intercepting region (34 in FIG. 3B) of radius $\sigma 2$, wherein $\sigma 2 \approx 0.8 \sigma 1$.

In order to measure the light intensity of the conventional illumination, the area of the light-transmitting region must be calculated. First, if the radius of the aperture used in the conventional illumination is assumed to be 1, the area of the light-transmitting region thereof may be calculated as:

$$\pi r^2 = \pi(\sigma 1)^2 = \pi \times 1 \times 1 = \pi$$

Using the above results, the area of the light-intercepting part (34 in FIG. 3B) of the aperture used in the conventional OAI may be calculated as:

$$\pi r^2 = \pi(\sigma 2)^2 = \pi \times 0.8 \times 0.8 = 0.64\pi$$

Accordingly, the area of the real light-transmitting region (32 in FIG. 3B) of the aperture used in the conventional OAI may be calculated as:

$$\pi - 0.64\pi = 0.34\pi$$

This means that light transmittance, that is, light intensity of the aperture used in the conventional OAI is 34% of that of the aperture used in the conventional illumination. The quadrupolar aperture has a lowered light intensity which is similar to that of the annular aperture. Accordingly, the aperture used in the conventional OAI intercepts light at its center, which makes it necessary to extend the exposure time due to the diminished light intensity. The extra time required leads to a deterioration in productivity, thus having undesirable effects on processes for mass production.

SUMMARY OF THE INVENTION

To overcome the problems of the conventional OAI, one object of the present invention is to provide an aperture which increases light intensity.

Another object of the present invention is to provide a projection exposure apparatus employing such an aperture which increases light intensity.

To achieve the first object of the present invention, there is provided an aperture for an OAI including a light-intercepting region and a light-transmitting region, wherein the light-transmitting region is prismoidal and diffracts incident light toward the periphery of the condenser lens.

In a preferred aspect of the present invention, the aperture is provided as an annular aperture adapted to have a first light-intercepting region at the center for intercepting zero-order diffracted light, a light-transmitting region which surrounds the first light-intercepting region and diffracts incident light toward the periphery of the condenser lens, and having a second light-intercepting region surrounding the light-transmitting region.

It is preferred that the whole or a part of the light-transmitting region is formed to have a prismoidal shape.

It is preferred that the first light-intercepting region is thicker than or has the same thickness as the second light-intercepting region.

To achieve a second object of the present invention, there is provided a projection exposure apparatus comprising: a light source; a "fly's eye" lens for controlling the intensity of light from the light source; an aperture including a prismoidal light-transmitting region for diffracting the light transmitted from the "fly's eye" lens toward the periphery of the condenser lens; a condenser lens for illuminating the light transmitted from the aperture on a photomask; a photomask having predetermined patterns for receiving and transmitting the light transmitted from the condenser lens according to said patterns; an objective lens for focusing the light transmitted from the photomask onto a wafer; and a wafer on which patterns are formed by the light illuminated and focused from the objective lens.

It is preferred that the aperture used in the apparatus of the present invention is an annular aperture or a quadrupolar aperture.

According to the present invention, enlarging the light-transmitting region area leads to an increase in light intensity, which results in a reduced exposure time and in improved productivity.

DETAILED DESCRIPTION OF THE INVENTION

The above objects and advantages of the present invention will become more apparent by describing preferred embodiments thereof in detail while referring to the attached drawings.

An aperture for an OAI according to the present invention includes a light-intercepting region and a light-transmitting region, wherein the light-transmitting region is prismoidal and diffracts incident light toward the periphery of the condenser lens.

Figure 1:
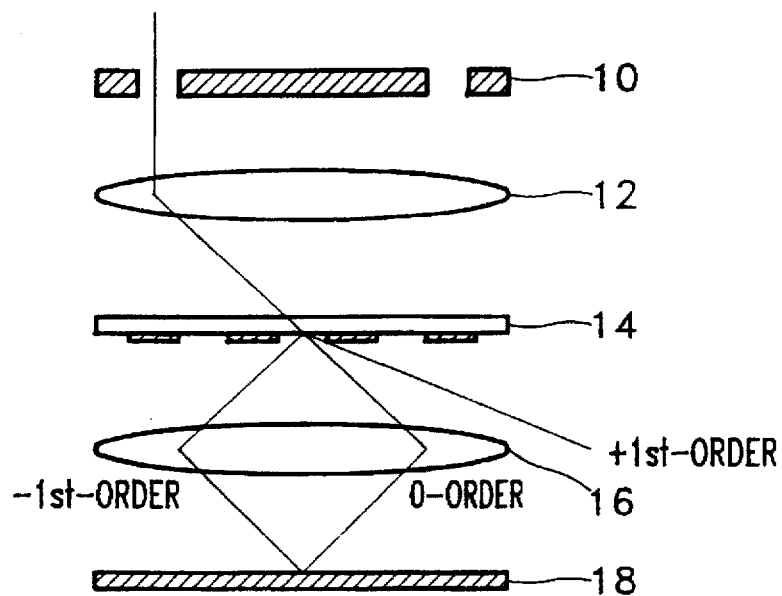
FIG. 1 schematically shows a projection exposure apparatus used in a conventional OAI.
Figure 2:
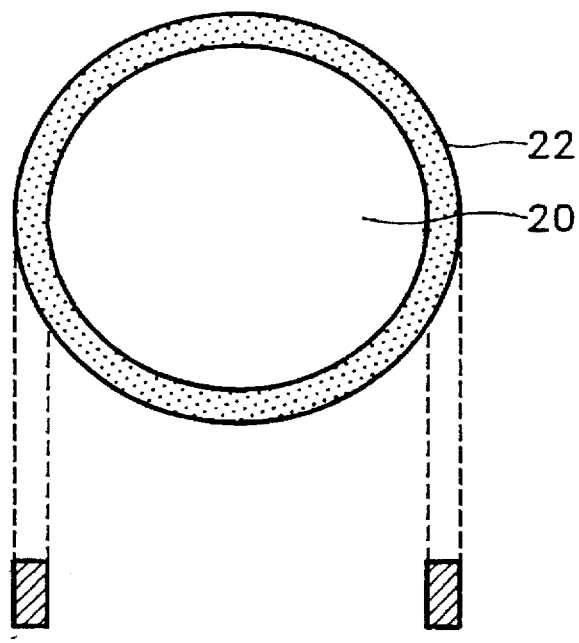
FIG. 2 shows an aperture used in a conventional illumination apparatus.
Figure 3A:
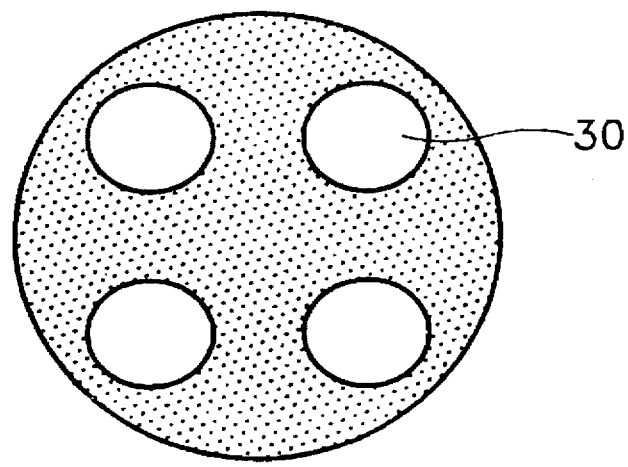
FIG. 3A shows a quadrupolar aperture used in the conventional OAI.
Figure 3B:
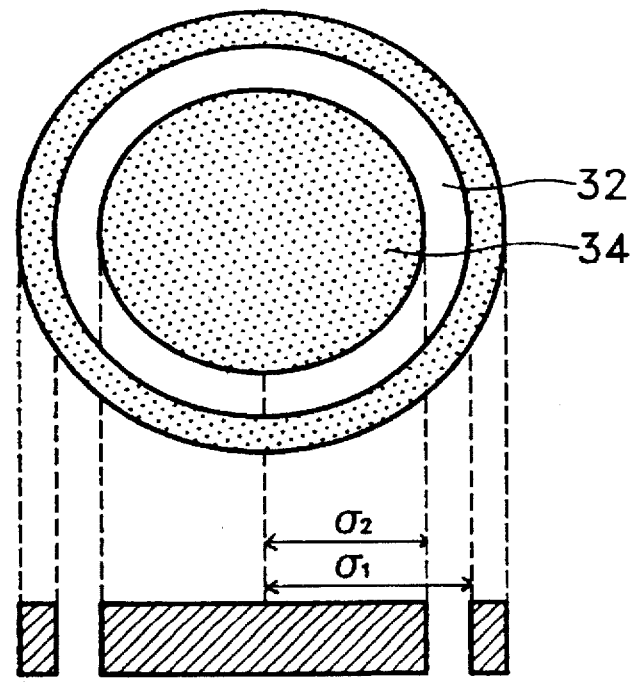
FIG. 3B shows an annular aperture used in the conventional OAI.
Figure 4:
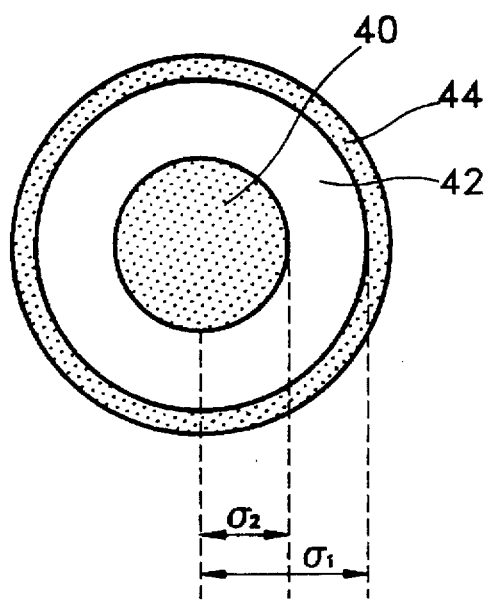
FIG. 4 shows a plan view of a modified aperture according to the present invention.

FIG. 4 is a plan view of an annular aperture according to an embodiment of the present invention. As shown in FIG. 4, it is preferred that the aperture according to the embodiment of the present invention includes a first light-intercepting region 40 in the center for intercepting vertically incident light, a light-transmitting region 42 which surrounds first light-intercepting region 40 and diffracts incident light toward the periphery of the condenser lens, and a second light-intercepting region 44 surrounding light-transmitting region 42.

More specifically, the aperture of the present invention is structured so that the zero-order diffracted light-intercepting region of the aperture of the present invention has a smaller area than that of the annular aperture used in the conventional OAI to increase the light intensity. In the aperture according to the present invention more light is diffracted at light-transmitting region 42 to improve the relatively weak OAI effect. That is, in comparison to the conventional annular aperture, the radius (σ2) of zero-order diffracted light-intercepting region 40 located at the center of the aperture is reduced, while the radius (σ1) of light-transmitting region 42 is enlarged. Also, the light-transmitting region is formed to be prismoidal in shape. Thus, incident light which is diffracted toward the periphery of the condenser lens may be controlled by adjusting the OAI angle of the incident light.

In the aperture according to the present invention, the radius σ2 of the first light-intercepting region 40 at the center is approximately 0.57 times that of the radius of the aperture 42. Therefore, assuming that σ1, the radius to the inner edge of the second light-intercepting region 44, of the aperture is 1, the area of the first light-intercepting region may be calculated as:

$$\pi r^2 = \pi(\sigma 2)^2 = 0.57 \times 0.57 \times \pi = 0.325\pi$$

In turn, the area of real light-transmitting region (42 in FIG. 4) may be calculated as:

$$\pi(\sigma 1)^2 - \pi(\sigma 2)^2 = \pi - 0.325\pi = 0.675\pi$$

Hence, the light intensity is about 68% of that of the aperture used in the conventional illumination, which is twice as high as the conventional OAI light intensity of about 34%.

Figure 5A:
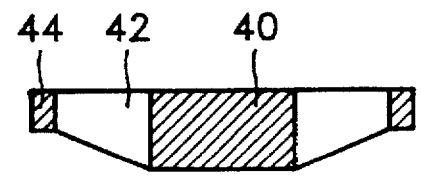
FIG. 5A is a vertical cross-sectional view of the aperture according to embodiment 1 of FIG. 4.
Figure 5B:
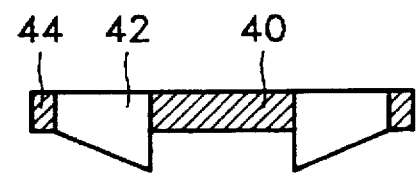
FIG. 5B is a vertical cross-sectional view of the aperture according to embodiment 2 of FIG. 4.
Figure 5C:
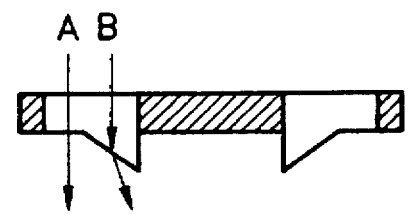
FIG. 5C is a vertical cross-sectional view of the aperture according to embodiment 3 of FIG. 4.

FIGS. 5A through 5C show vertical cross-sectional views of the aperture according to the embodiments of the present invention.

Referring to FIGS. 5A through 5C, light-transmitting region 42 is formed into a prismoidal shape, which is adapted to cause transmitted light to be diffracted toward the periphery of the condenser lens.

In the annular aperture according to the present invention, it is preferred that the first light-intercepting region 40 is thicker (FIG. 5A) than the second light-intercepting region 44, or has the same thickness (FIG. 5B) as second light-intercepting region 44. Furthermore, as shown in FIG. 5C, a part of the light-transmitting region 42 can be formed to be prismoidal in shape. In such a case, incident light A to the oblique-light incident region transmits straight down and incident light B to the light-diffracting region diffracts at a predetermined angle towards the periphery of the condenser lens.

An advantage of forming the annular aperture having a first light-intercepting region 40, which is thicker than the second light-intercepting region 44, is that the annular aperture may be manufactured with greater ease. A quartz substrate is a preferred material to be used in manufacturing the aperture.

According to the aperture of the present invention, the prismoidal light-transmitting region can be applied to any type of aperture including the quadrupolar aperture and annular apertures. In forming such quadrupolar or annular apertures, the quartz substrate can be used as the base material for forming the aperture.

Figure 6:
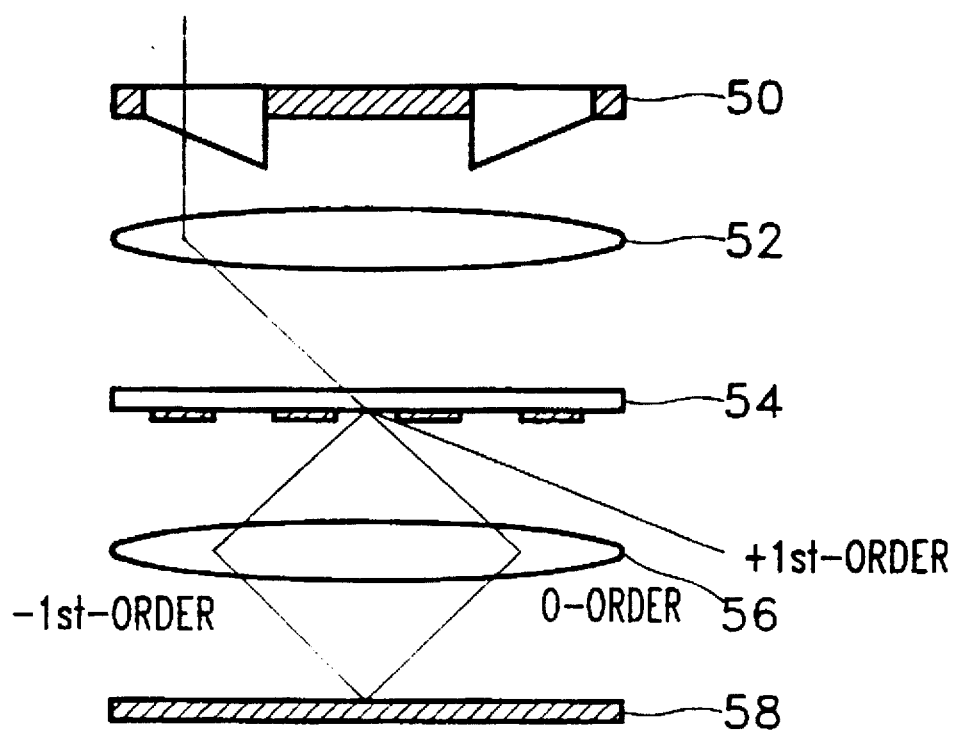
FIG. 6 schematically shows a projection exposure apparatus employing a modified aperture according to the present invention.

FIG. 6 illustrates a projection exposure apparatus employing the aperture for the OAI according to the present invention, wherein the aperture includes a prismoidal light-transmitting region for diffracting incident light toward the periphery of the condenser lens.

Referring to FIG. 6, the projection exposure apparatus includes an aperture 50 having a prismoidal light-transmitting region, a condenser lens 52, a photomask 54, an objective lens 56, and a wafer 58.

More specifically, light illuminated from a light source diffracts toward the periphery of the condenser lens while passing through aperture 50. The light transmitted from condenser lens 52 is incident on photomask 54 at a predetermined angle. Of the light transmitted from photomask 54, noneffective light (+1st-order diffracted light) strays beyond objective lens 56 and effective light (zero-order and −1st-order diffracted light) is focused by objective lens 56 to illuminate on wafer 58. The obliquely incident light on photomask 54 has higher light intensity than that of the conventional aperture.

Since the light-transmitting region of aperture 50 is larger than that of the conventional aperture, light intensity is enhanced. Further, aperture 50 has a prismoidal light-transmitting region for diffracting the incident light toward the periphery of the condenser lens, thereby attaining the off-axis illumination effect. An annular aperture or quadrupolar aperture can be used as the aperture according to the present invention.

According to the aperture and the projection exposure apparatus according to the present invention, the enlarged light-transmitting region results in higher light intensity than that of the conventional aperture allowing for a shortened exposure time and increased productivity.

While this invention has been described with respect to that which is presently considered to be the most practical and preferred embodiments, the invention is not limited to such disclosed embodiments. It is clearly understood that many variations can be possible within the scope and spirit of the present invention by any one skilled in the art. In fact, it is intended that the present invention cover various modifications and equivalent arrangements within the spirit and scope of the appended claims.

What is claimed is:

1. An aperture for an off-axis illumination (OAI) apparatus comprising a light-intercepting region and a light-transmitting region, wherein at least a part of said light-transmitting region is of a prismoidal shape which diffracts incident light toward the periphery of a condenser lens.

2. An aperture for an OAI apparatus as claimed in claim 1, wherein said aperture is an annular aperture comprising:

a first light-intercepting region at the center for intercepting zero-order diffracted incident light, a light-transmitting region which surrounds said first light-intercepting region and diffracts incident light toward the periphery of a condenser lens; and a second light-intercepting region surrounding the light-transmitting region.

3. An aperture for an OAI apparatus as claimed in claim 2, wherein said first light-intercepting region is thicker than said second light-intercepting region.

4. An aperture for an OAI apparatus as claimed in claim 2, wherein said first light-intercepting region has the same thickness as said second light-intercepting region.

5. An aperture for an OAI apparatus as claimed in claim 2, wherein said light-transmitting region is formed to be prismoidal in shape.

6. A projection exposure apparatus comprising:

a light source;

a fly's eye lens for controlling the intensity of light from said light source;

an aperture including at least a light-transmitting region with one prismoidal shape for diffracting the light transmitted from said fly's eye lens toward the periphery of a condenser lens, said condenser lens illuminating the light transmitted from said aperture on a photomask;

a photomask having predetermined patterns for receiving and transmitting the light transmitted from said condenser lens according to said patterns;

an objective lens for focusing the light transmitted from said photomask onto a wafer; and a wafer on which patterns are formed by the light illuminated and focused from said objective lens.

7. A projection exposure apparatus as claimed in claim 6, wherein the light transmitted from said aperture is double annular.

8. A projection exposure apparatus as claimed in claim 6, wherein said aperture is one selected from the group consisting of an annular aperture and a quadrupolar aperture.

9. A projection exposure apparatus as claimed in claim 8, wherein said light-transmitting region of said aperture is formed to be prismoidal in shape.

* * * * *